United States Patent [19]

Jensen

[11] Patent Number: 5,504,457
[45] Date of Patent: Apr. 2, 1996

[54] PULSED POWER AMPLIFIER FOR AMPLIFYING RF SIGNALS

[75] Inventor: Ole Jensen, Kobenhavn, Denmark

[73] Assignee: Motorola, Inc., Schaumburg, Ill.

[21] Appl. No.: 28,095

[22] Filed: Mar. 8, 1993

[30] Foreign Application Priority Data

Sep. 6, 1990 [GB] United Kingdom ............... 90194511

[51] Int. Cl.$^6$ ........................................ H03G 3/30
[52] U.S. Cl. ..................... 330/129; 330/279; 455/126
[58] Field of Search .................................. 330/127, 129, 330/141, 279, 281; 455/116, 126, 127

[56] References Cited

U.S. PATENT DOCUMENTS

| | | | |
|---|---|---|---|
| 4,412,337 | 10/1983 | Bickley et al. | 455/126 X |
| 5,101,175 | 3/1992 | Vaisanen | 330/279 |
| 5,128,629 | 7/1992 | Trinh | 330/279 X |
| 5,150,075 | 9/1992 | Hietala et al. | 330/129 X |
| 5,309,115 | 5/1994 | Hashimoto et al. | 330/279 X |

*Primary Examiner*—James B. Mullins
*Attorney, Agent, or Firm*—Richard A. Sonnentag; Kevin A. Buford

[57] ABSTRACT

This invention relates to a pulsed power amplifier 100 for amplifying radio frequency signals. The pulsed power amplifier comprises control means 124, 126, 102 for generating control signals to control the amplifier output power so as to provide an output power pulse having rising and falling transitional phases, and means 112, 114, 117, 118, 122, 132, 134, 137, 138, 142 for generating a subsidiary pulse signal to be applied to the control means in order to adjust a transitional phase of the output power pulse. The generation of the subsidiary pulse may depend on a measured parameter of a previous output power pulse, such as the time taken for a preceding output power pulse to reach a predetermined output power level. Alternatively, the generation of the subsidiary pulse may depend on a parameter of the present output power pulse. In both cases the generating means can control the magnitude of the subsidiary pulse in response to the parameter.

4 Claims, 10 Drawing Sheets

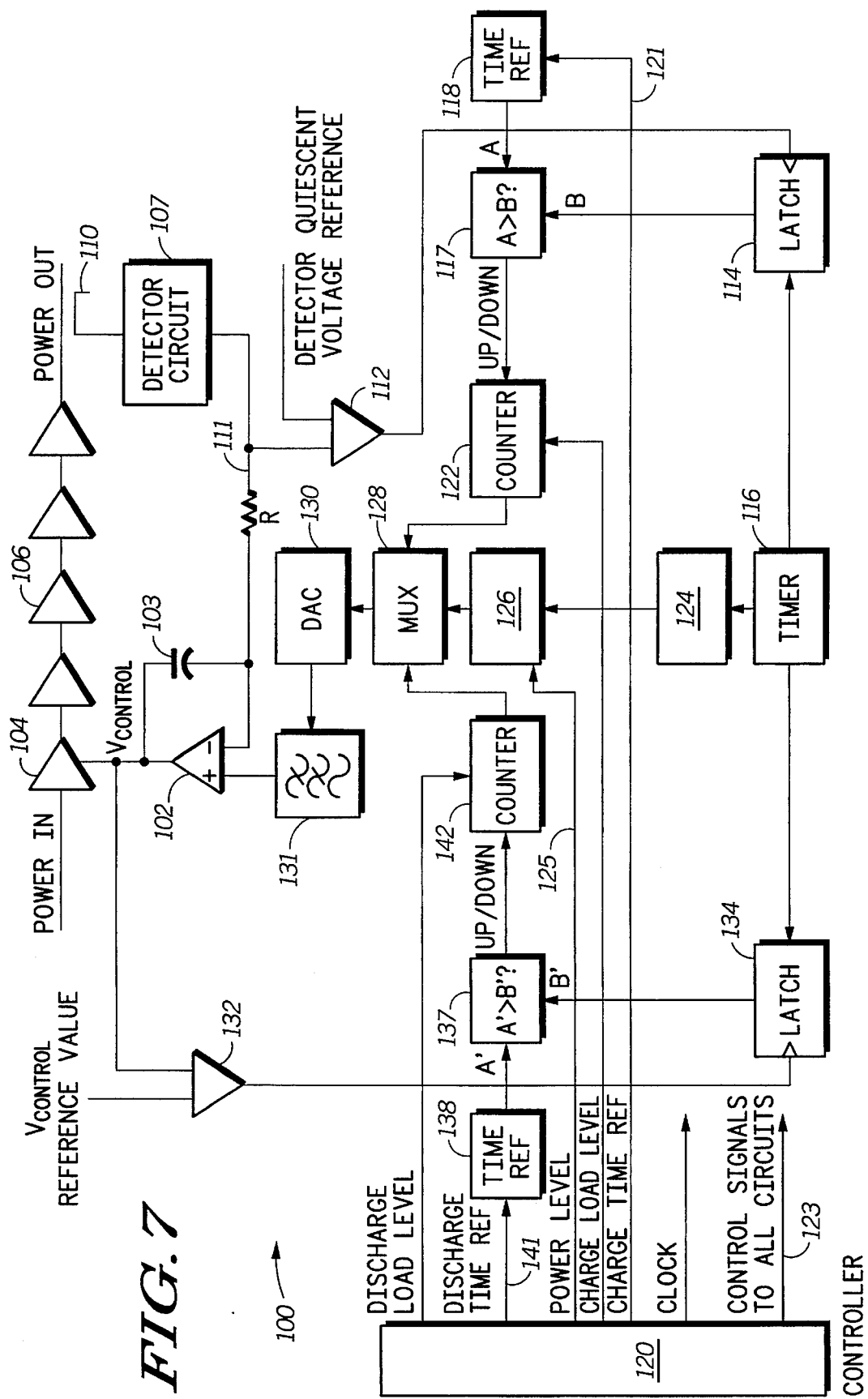

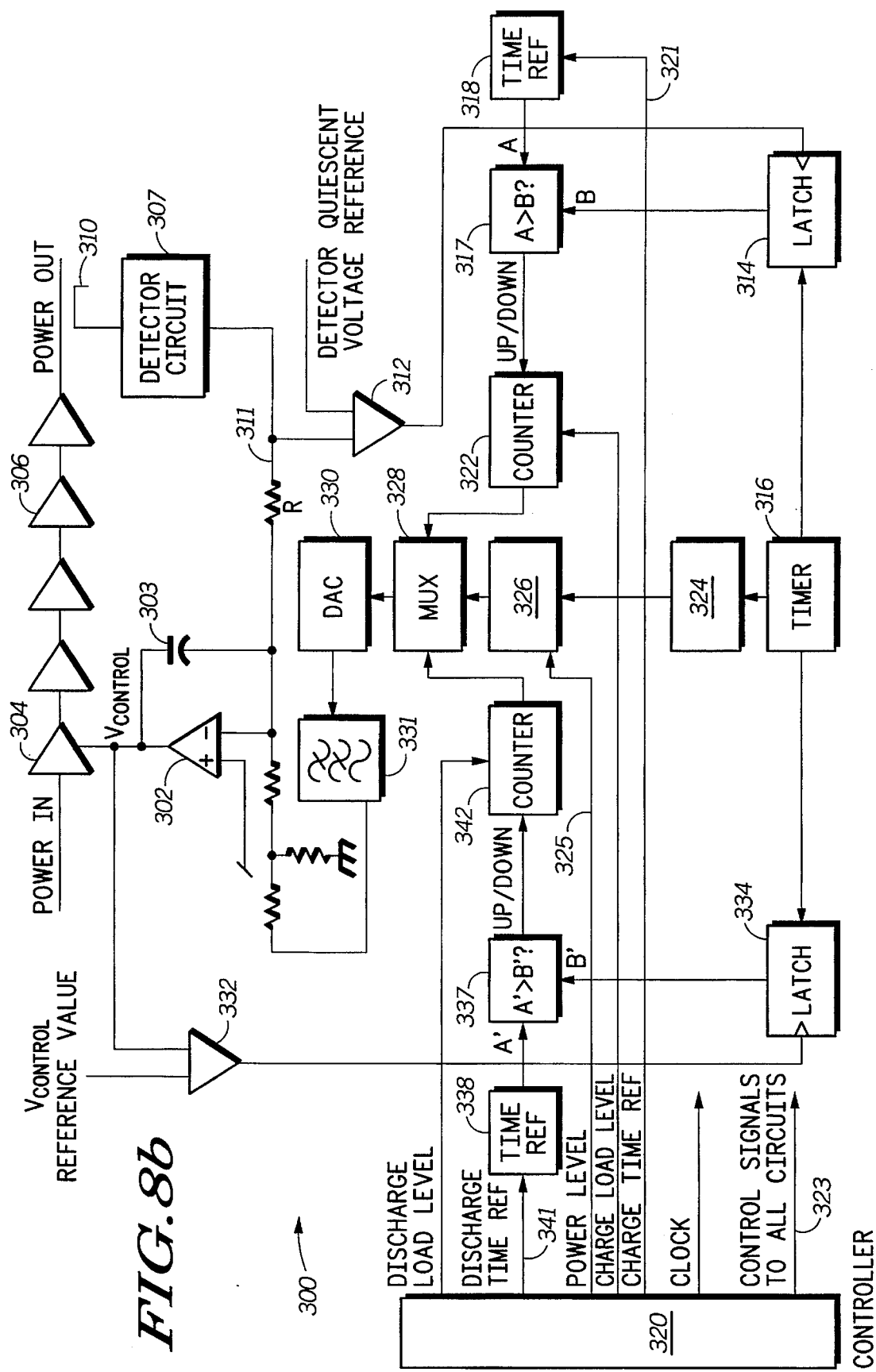

PULSED POWER AMPLIFIER FOR AMPLIFYING RF SIGNALS

This application is a continuation of international application PCT/EP91/01585, filed Aug. 21, 1991.

This invention relates to power amplifiers, such as pulsed power amplifiers, for amplifying radio frequency signals. This invention particularly relates to power amplifiers for use in GSM radio transmitters.

The output power characteristics of a pulsed power amplifier must follow a time mask upon turn-on and turn-off, as well as a frequency spectrum mask. For GSM radio transmitters, it is particularly important that upon turn-on, at the start of the burst, the output power is ramped up very quickly but very smoothly so that the spectral noise is limited to certain specified levels. If the output power is ramped up too quickly, the spectral noise will be too high. If, however, the power is ramped up too slowly, the spectral noise will be low but the output power waveform will not follow the time mask. Moreover, it is also important that on turn-off, at the end of the burst, the output power is ramped down very quickly. Thus, GSM radio transmitters are required to operate to meet strict specifications for both the time mask and frequency mask.

European Patent application number EP-A-0261 967 describes a power control circuit which is arranged to automatically control the output power level of an amplifier circuit and which can be controlled by an external signal.

EP patent application no. 89117213.2 and UK patent application no. 9003663.3 disclose burst modulated power amplifiers which may be used in GSM mobile radio transmitters and whose output power characteristics upon turn-on and turn-off are controlled by power control signals which represent predetermined amplifier output power waveforms: these waveforms comprise ramp-up waveforms and ramp-down waveforms.

An example of the output power versus time characteristics for power amplifiers according to these patent applications is shown by curve 12 in FIG. 1a: the output power versus frequency characteristics is shown by curve 14 in FIG. 1b. The time mask and frequency mask for the GSM specification are marked on curves 12 and 14 respectively.

A problem suffered by the prior art power amplifiers is that the power output curves 12 and 14 are highly dependent on temperature, supply voltage, radio frequency and input power variations. If the temperature, supply voltage, radio frequency or input power varies, the obtained power versus time and power versus frequency curves will deviate significantly from the curves 12 and 14 shown in FIGS. 1a and 1b to the extent that the GSM specification for both the time mask and the frequency mask is not met. Such variations are most likely to result from the large scale reproduction of radios and from the environment in which the radios are used.

FIG. 2 shows a section of a prior art power amplifier comprising integrator 2 coupled to an attenuator or gain controlled amplifier 4 which is controlled by a feedback loop 8 including a power detector 99. An RF signal is supplied to an input of the attenuator or gain controlled amplifier 4 whose output is coupled to a RF power amplifier 6. The output of the power amplifier is fed to an antenna (not shown).

The output power of the power amplifier is controlled by the output from the integrator ($V_{control}$). The positive input of the integrator 2 receives voltage signals which represent predetermined output power response waveforms. The relationship between the output power of the power amplifier ($P_{out}$) and $V_{control}$ is shown in FIG. 3. When the power is off, the positive input to the integrator 2 is around zero and the voltage from the power detector (not shown) is at its quiescent value which is a fraction higher than zero. Therefore, the integrator output $V_{control}$ is zero and as can be seen in FIG. 3, the output power, $P_{out}$, is also zero. On turn-on, at the start of the burst, a voltage higher than the detector quiescent value must be applied to the positive input of the integrator 2. This immediately starts charging the integrator capacitor 3.

The power detector 99 in the feedback loop 8 is sensitive down to a certain minimum power level, $P_0$. In order that the output power of the power amplifier reaches this level $P_0$, the control voltage $V_{control}$ outputted from the integrator 2 must reach a level $V_0$. This takes some time which depends on the value of $V_0$ and on the integrator time constant T whose equation is:

$$T = RC \qquad (1)$$

where R is the resistance of the integrator and C is the capacitance of the integrator capacitor 3.

T can be considered relatively constant but $V_0$ varies with temperature, supply voltage, radio frequency and input power. Thus, the time for the integrator output to reach $V_0$ from turn-on and hence the amplifier output power to reach $P_0$, will vary with these operating parameters: i.e. temperature, supply voltage, radio frequency and input power.

In order that the output power of the power amplifier meets the GSM specifications for both the time mask and frequency mask, it is important that the output power closely follows the predetermined waveforms defined by the voltage signals applied to the positive input of the integrator 2. That is, the power detector voltage should almost equal the voltage applied to the positive input of the integrator 2 with, however, a small time delay. This will be true once the feedback loop is activated. However, to activate the loop, the output power must be above $P_0$ which takes a varying amount of time depending on the time taken for the control voltage to reach $V_0$ and as discussed above, $V_0$ varies with temperature, supply voltage, radio frequency and input power.

When $V_0$ increases, due to for example a temperature change, the integrator's charging time required to reach 'new' $V_0$ increases and hence the power detector voltage does not immediately follow the ramp-up waveform defined by the integrator output. This produces a rapid turn on of the output power which destroys the switching spectrum of the output signal (as shown in FIG. 4a) to the extent that the frequency mask of the GSM specification is not followed.

When the integrator's charging time decreases, which occurs if $V_0$ decreases with, for example, a change in temperature, the power detector voltage will exceed the voltage at the positive input of the integrator 2 before the ramp-up waveform is applied to the positive input, and this typically destroys the time mask and the switching spectrum (as shown in FIGS. 5a and 5b).

The above problems associated with the prior art power amplifiers are not only limited to the start of the burst with ramp-up. Problems also arise at the end of the burst with ramp-down.

The temperature in the power amplifier itself will change during the burst because of the power dissipated in the power amplifier's circuits. This produces a temperature change, a change in gain and a change in the maximum output power from the power amplifier. With an RF amplifier made in bipolar technology the maximum output power and gain is typically reduced when the temperature rises. Thus, due to the reduced gain, the only possible way of ensuring that the actual output power of the power amplifier remains constant throughout the burst is for the feedback loop to increase the control voltage in response to the temperature rise. This increase in $V_{control}$ is shown on curve 10 of FIG. 6a which shows the variation of $V_{control}$ with time.

At low output power levels, only small increases in the control voltage $V_{control}$ are required since, as can been seen from the curve of FIG. 3, at low output power levels small changes in $V_{control}$ produce large changes in the output power. At high output power levels, however, a larger change in the control voltage is required to change the output power as shown in FIG. 3. Therefore, $V_{control}$ will reach its maximum value at the end of the burst where the amplifier temperature will be a maximum.

At the end of the burst, when the ramp-down is about to begin from a very high output power level, $V_{control}$ will therefore also be very high. At this point, the curve of $P_{out}$ versus $V_{control}$ is very flat (see FIG. 3). Since the loop controlling the output power must follow the voltage signals at the positive input of the integrator 2, which represent in this case the ramp-down waveform, the integrator must be very fast to compensate for the high output power level and the high $V_{control}$. At lower power levels, the curve of $P_{out}$ versus $V_{control}$ is steeper (see FIG. 3) and the loop would become unstable if the integrator was too fast. Therefore, in order that the output power may follow the ramp-down waveform as closely as possible a compromise between these two extremes must be selected.

However, irrespective of the conditions which are selected for the compromise, the ramp-down from a very high output power level can be a problem because of the flat curve of $P_{out}$ versus $V_{control}$ at high levels. This flatness gives an extra delay between the time when the voltage signals defining the ramp-down waveform are applied to the integrator and the time when the output power responds accordingly. This has the effect of destroying the time mask performance. When the output power eventually responds, it may fall much too quickly, which will also destroy the frequency mask performance.

Thus, the prior art power amplifiers suffer from problems associated with variations in temperature, supply voltage, radio frequency and input power which can destroy the time mask and frequency mask performance. In addition, problems can arise, due to the response time of the integrator, on ramp-down from a high power level, which can also destroy the time mask and frequency mask performance.

In accordance with the invention there is provided a pulsed power amplifier for amplifying radio frequency signals comprising:

control means for generating control signals to control the amplifier output power so as to provide an output power pulse having rising and falling transitional phases; and means for generating a subsidiary pulse signal to be applied to said control means in order to adjust a transitional phase of the output power pulse.

The generation of subsidiary pulse may depend on a measured parameter of a previous output power pulse, such as, the time taken for a preceding output power pulse to reach a predetermined output power level. The generating means may be arranged to control the magnitude of the subsidiary pulse in response to the measured time.

Alternatively, the generation of subsidiary pulse may depend on a parameter of the present output power pulse. For example, the generating means may determine when the power level of the output power pulse goes above a threshold power level and in response thereto may generate a subsidiary pulse to adjust a transitional phase of the output power pulse. Once a subsidiary pulse has been generated, when the output power pulse goes above a threshold power level, the subsequent subsidiary pulses generated by the generating means may depend on a measured parameter, such as the time taken for a preceding output power pulse to reach a predetermined output power level, of a previous output power pulse.

Preferably, the pulsed power amplifier further comprises storage means, such as a look-up table, for storing a set of predetermined subsidiary pulse data, each of the set of subsidiary pulse data corresponding to different operating parameters of the pulsed power amplifier wherein the subsidiary pulse depends on a selection from the set of stored subsidiary pulse data.

The pulsed power amplifier in accordance with the invention preferably comprises a feedback loop including sensing means for sensing the output power of the power amplifier, the control means and power amplifying means for providing output power pulses in response to the output from the control means. The generating means is coupled to the control means and the sensing means and is arranged to generate a subsidiary pulse to activate the control means without delay thereby activating the feedback loop.

Thus, it will be appreciated that an advantage of the present invention is that by using a subsidiary pulse, immediately before the rising transitional phase, to activate the control means without delay, the feedback loop can be activated before the rising transitional phase and hence the output power of the power amplifier can closely follow the predetermined waveforms applied to the control means.

A further advantage of the present invention is that since the subsidiary pulse is dependent on a measured parameter of a previous output power pulse, the subsidiary pulse can be automatically varied to take account of variations in the operating parameters such as temperature, input power, radio frequency and supply voltage, thereby ensuring that the power amplifier operates substantially perfectly even with changes in the operating parameters.

A further advantage of the present invention is that since the generating means can generate a subsidiary pulse when the output power goes above a threshold level, the subsidiary pulse, on ramp-down from high power levels for example, ensures that there is no delay in the response of the control means. Hence, the output power of the power amplifier can closely follow the predetermined waveforms applied to the control means.

Three embodiments of the present invention will now be described, by way of example only, with reference to the accompanying drawings in which:

FIG. 7 is a block schematic diagram of a first power amplifier in accordance with the present invention;

FIG. 8b is a block schematic diagram of a third power amplifier in accordance with the present invention;

Figure 2:
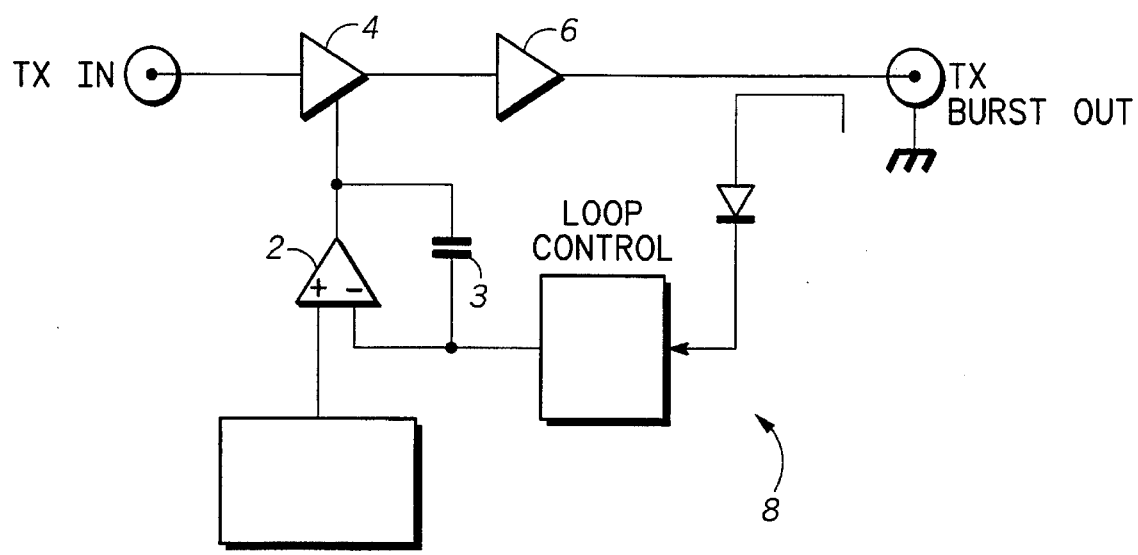
FIG. 2 is a block schematic diagram of a prior art power amplifier.

Referring now also to FIG. 7, a power amplifier 100 comprises an integrator 102 having an integrating capacitor 103. The output from the integrator 102 is coupled to an attenuator 104. An RF signal is applied to an input of the attenuator 104 whose output is coupled to RF power amplifier stages 106. Like components to those of FIG. 2 are referenced by the same reference numeral plus one hundred.

Figure 1A:
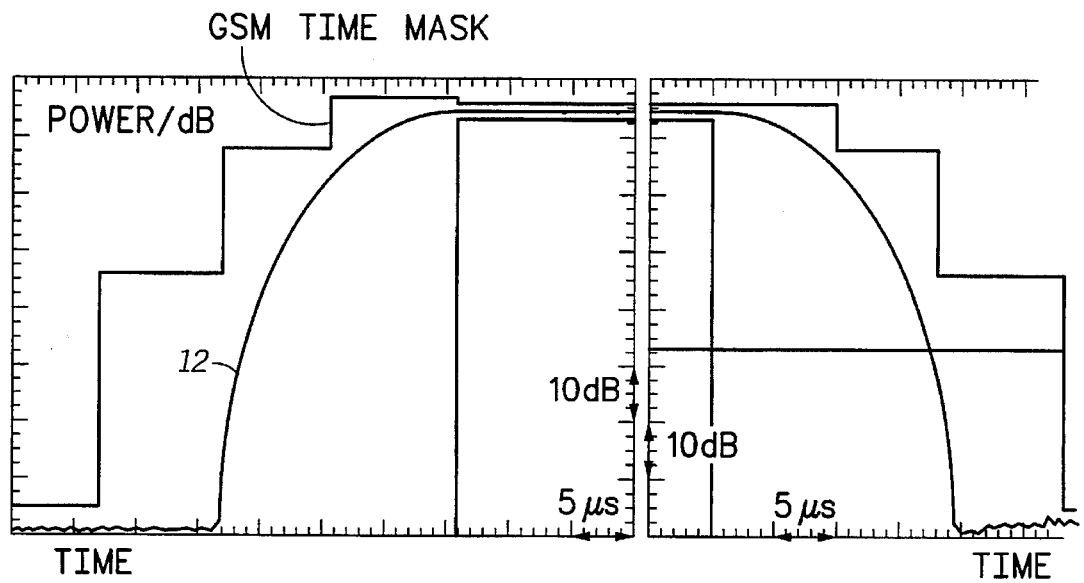
FIG. 1a is a diagrammatic representation of an ideal output power versus time response of a power amplifier and shows the time mask specification for a GSM radio.
Figure 1B:
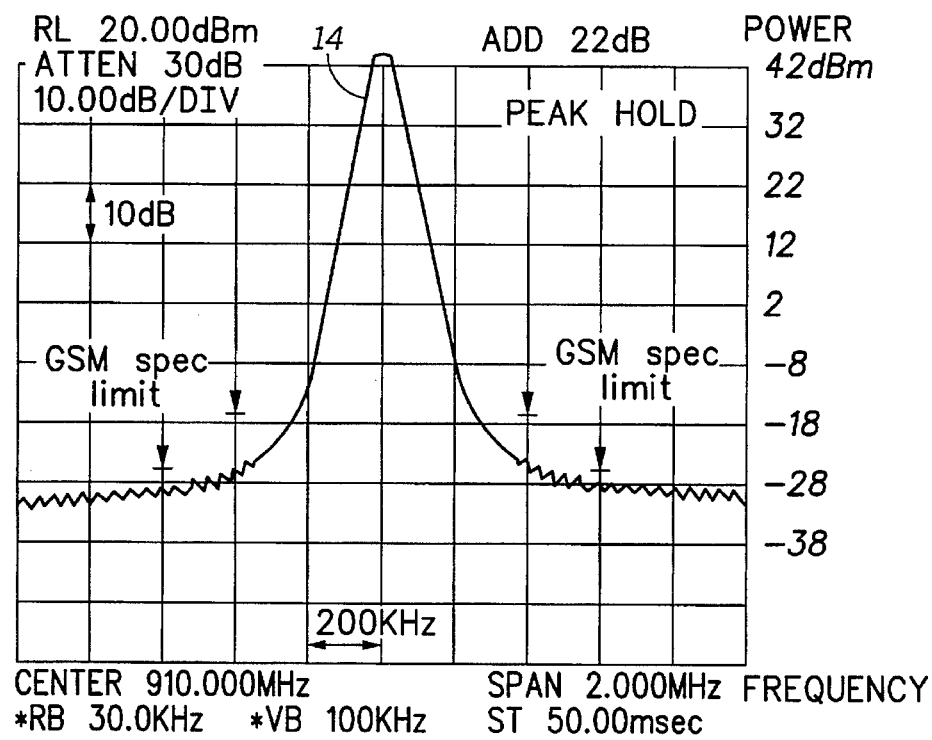
FIG. 1b is a diagrammatic representation of an ideal output power versus frequency response of a power amplifier and shows the frequency mask specification for a GSM radio.
Figure 6A:
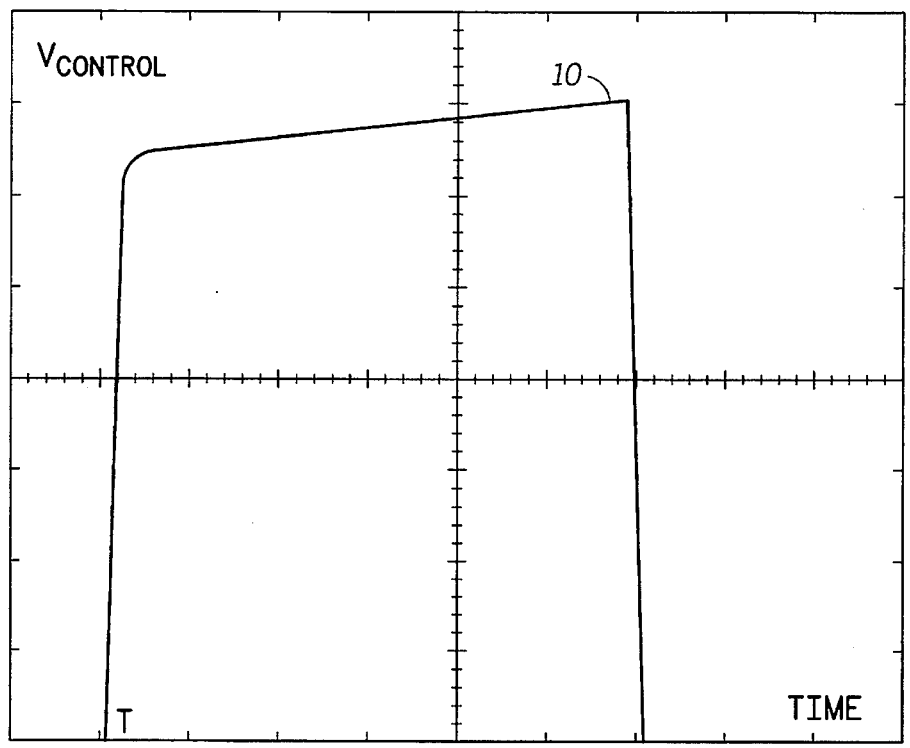
FIG. 6a is a diagrammatic representation of the control voltage versus time of the power amplifier of FIG. 2.
Figure 6B:
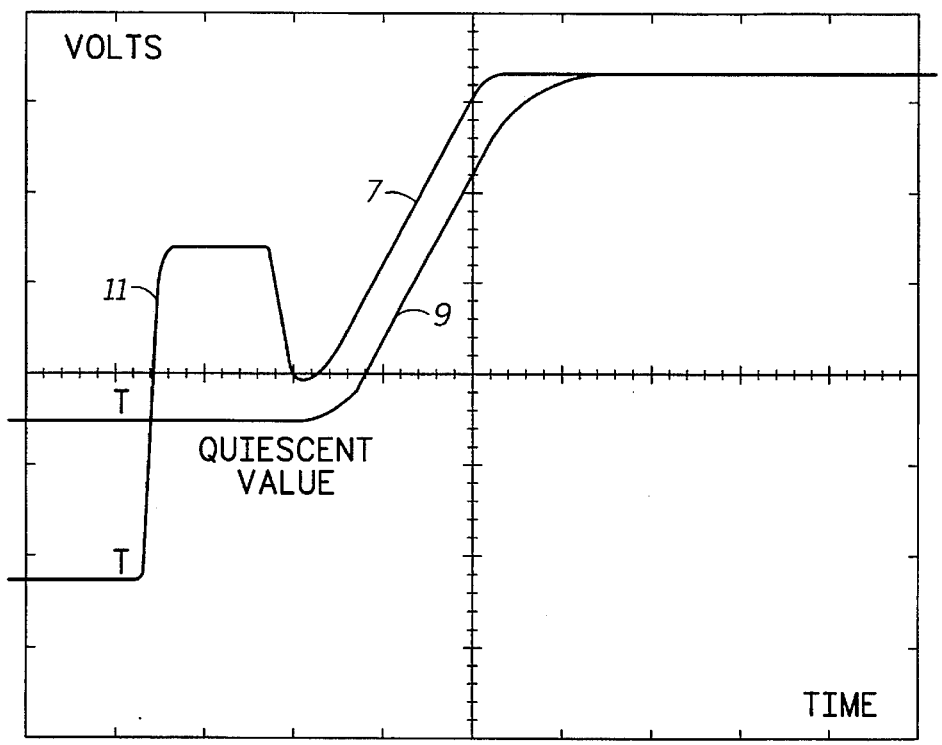
FIG. 6b is a diagrammatic representation of the voltage signals applied to the control means and the detector voltage of a power amplifier in accordance with the present invention.

One solution to the problems associated with the prior art power amplifiers is to ensure that the loop is activated before ramp-up starts in which case, the desired output power curves 12 and 14 will be obtained as shown in FIGS. 1a and 1b. This can be achieved by applying a charge pulse to the positive input of the integrator 2 at the start of the burst before the ramp-up waveform is applied. FIG. 6b shows the voltage signal 7 applied at the positive input of the integrator 102 and the voltage signal 9 of the power detector. The charge pulse 11, seen before the ramp-up starts, is used to charge the integrator 102 by an amount which ensures that the control voltage outputted from the integrator reaches the level $V_0$ before ramping can begin. That is, a charge pulse is applied to the integrator before ramp-up in order to ensure that the integrator is charged before ramp-up starts.

However, since the time required to charge the integrator varies with temperature, supply voltage, radio frequency and input power, this method also suffers from problems associated with changes in such operating parameters.

This problem is overcome by ensuring that the integrator is always charged by the correct amount for ramp-up or discharged by the correct amount for ramp-down irrespective of changes in the operating parameters. A first power amplifier in accordance with the present invention will now be described in detail.

A power sensor 110 is coupled to detect the output power from the power amplifier stages 106. The output of the power sensor 110 is connected to the power detector 107 whose output is coupled to the negative input of the integrator 102 and to a first input of a comparator 112. A reference voltage which represents the quiescent voltage level of the power detector 107 is applied to a second input of the comparator 112. Depending on the output from the comparator 112, the instantaneous value of the timer 116 is latched into a latch 114. This timer value B is then applied to a first input of a second comparator 117 which receives a reference time signal A at its second input from a reference time source 118. The value of the reference time signal from the reference time source 118 is controlled by a controller 120 which is coupled to the reference time source 118 via line 121. The output from the second comparator 117 is fed to a counter 122 which in response thereto controls the size of the charge pulse to be applied via a multiplexer 128 to the positive input of the integrator 102.

Examples of means and methods for the generation of the predetermined amplifier output power waveforms are described in EP patent application 89117213.2 and UK patent application 9003663.3, the disclosures of which are incorporated herein by reference thereto. Briefly, the ramp-up waveform is generated as follows. For a more detailed description the reader is invited to read the above referenced patent applications.

In response to control signals from the controller 120 (via line 123) and the clock signals from the timer 116, the ramp waveform generator 124 generates a sequence of values representing a ramp-up waveform which is then fed to the modifying means 126 such as a ramp clipper. The ramp clipper 126 is controlled by power control data on a power control data line 125 which controls the clipping level of the ramp clipper 126. Thus, the output from the ramp clipper 126 may represent one of a plurality of different power output ramp-up waveforms depending on the selected power level. Ramp-down waveforms are generated in an identical manner.

The ramp waveform generator in EP patent application no. 89117213.2 can generate any one of the plurality of different power output ramp-up and ramp-down waveforms in response to the power control data without using the ramp clipper 126. Thus, although the invention is described with reference to generating ramp waveforms using digital circuitry and modifying means 126 as disclosed in EP patent application no. 9003663.3, it will be appreciated that the invention is not limited thereto.

The output from the ramp clipper 126 is then fed to the multiplexer 128 which also receives the output from counter 122. The output from the multiplexer 128 is then fed to a digital-to-analogue converter 130 to be smoothed by a low pass filter 131 before being applied to the positive input of the integrator 102.

The output from the integrator 102 is also coupled to a first input of a third comparator 132. A reference voltage which represents a predetermined threshold voltage level of the output of the integrator 102 i.e. $V_{control}$ is applied to the second input of the third comparator 132. Depending on the output from the comparator 132, the instantaneous value of the timer 116 is latched into a latch 134. This timer value B' is then applied to a first input of a fourth comparator 137 which receives a reference time signal A' at its second input from a reference time source 138. The value of the reference time signal from the reference time source 138 is controlled by a controller 120 which is coupled to the reference time source 138 via line 141. The output from the fourth comparator 137 is fed to a counter 142 which in response thereto controls the size of a discharge pulse to be applied via the multiplexer 128 to the positive input of the integrator 102.

The manner in which the present invention ensures that the integrator 102 is always charged by the correct amount at the start of the burst will now be described.

The time when the power detector voltage 107 rises above its quiescent value is detected using the first comparator 112, latch 114 and timer 116. When the detector voltage and quiescent reference voltage match, the output from the comparator 112 causes the instantaneous value of the timer 116 to be latched in the latch 114. This timer value is applied to the first input of the second comparator 117 and is then compared with a predefined ideal reference time from the reference time source 118.

The counter 122 uses the output from the comparator 117 to determine the size of the charge pulse to be applied to the integrator 102 at the start of a burst. If the power detector 107 voltage crosses the quiescent reference level too late, the charge pulse voltage must be increased before the next burst to improve the next burst. If the power detector 107 voltage crosses the quiescent reference level too soon, the charge pulse voltage must be decreased before the next burst. If, however, the detected time at which the power detector voltage crosses the quiescent reference level coincides with the predefined ideal reference time, the charge pulse voltage for the next burst must be the same as in the present burst. The value of the charge pulse is the value stored in the counter 122.

The amount of change in the charge pulse size can be selected in response to the output from the comparator 117 under the control of the controller 120. If the ramp waveform and charge pulse are generated by digital circuitry, the charge pulse size can be incremented/decremented by one digital value from one burst to the next or left unchanged as required. In addition, larger digital values could also be used to increment or decrement the size of the charge pulse. If a microprocessor or equivalent is available, the difference between the detected time and the ideal reference time can be computed and this value can be used to change the value of the charge pulse (the value stored in the counter 122). If, however, the ramp waveform and the charge pulse are generated by analog circuitry, then the degree by which the pulse size is changed can be set to any desired level. FIG. 7 shows an example of a digital implementation of the present invention.

Thus, it will be appreciated that since the size of the charge pulse can be varied according to how long it takes the control voltage, $V_{control}$, to reach the quiescent reference voltage level of the power detector 107, the effect of variations of temperature, supply voltage, radio frequency and input power on the power ramp-up is eliminated. That is, the present invention provides an adaptive ramp-up at the start of the burst.

In order that the power amplifier 100 operates perfectly or as near to perfectly as possible during the very first burst, the power amplifier can be arranged so that an initial charge pulse value can be downloaded thereto from the controller 120. If this value is based on knowledge of temperature, supply voltage, radio frequency and input power, the first burst should be substantially perfect: i.e. the detected time B will be substantially equal to or very close to the desired time A. If the first burst is not perfect, the adaptive romp-up principle outlined above will make sure that after a few more bursts, the burst will become perfect and will remain so. Thus, in all the subsequent bursts, the adaptive ramp-up principle will ensure that the time mask and frequency mask will be met despite variations in temperature, supply voltage, radio frequency and input power.

It will be appreciated that the initial value, which is downloaded to the power amplifier for the very first burst, may be stored in a look-up table which comprises a set of predetermined values for the charge pulses based on temperature, supply voltage, radio frequency and input power.

With the power amplifier 100 shown in FIG. 7, the voltage signals which represent the ramp waveforms (romp voltage signals) are applied to the positive input of the integrator 102. This means that there is a unity transient gain between the positive input and the integrator output. If the value of $V_0$ is small compared with the values of the ramp voltage and the size of the charging pulse, then the unity transient gain from the ramp voltage to the $V_{control}$ provides a problem, since the charge pulse may become so big that it will actually be higher than $V_0$. The result will be that the output power of the power amplifier is 'switched on' before the integrator 102 has been properly charged.

Figure 8A:
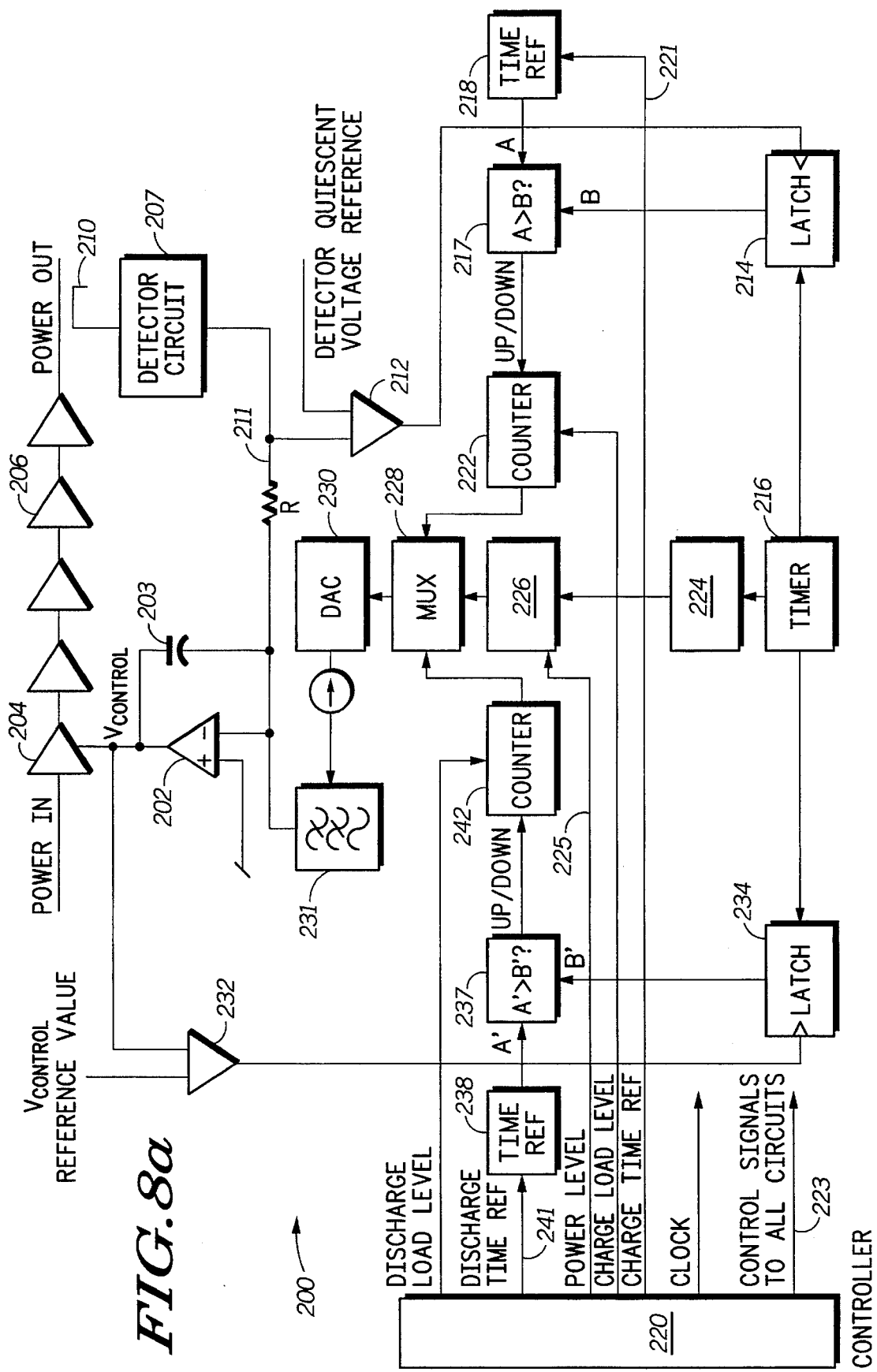
FIG. 8a is a block schematic diagram of a second power amplifier in accordance with the present invention.

This problem can be eliminated by changing the principle of inputting the ramp voltage to the positive input of the comparator, to inputting the ramp current to the negative terminal of the integrator, together with the voltage from the power detector. This means that there will no longer be unity transient gain from the ramp voltage or ramp current to the integrator output, $V_{control}$. Instead there is low pass filtering in the integrator. The charge pulse size can then be increased as much as required in order to charge the capacitor without producing any output power before the capacitor has been charged. FIGS. 8a and 8b show two alternative arrangements of the integrator driver using this principle for a power amplifier in accordance with the present invention. The operation of both these arrangements is identical as to that described above with reference to FIG. 7. Like components to those of FIG. 7 are referred to by the same reference numeral plus 200 and 300 respectively.

Figure 9A:
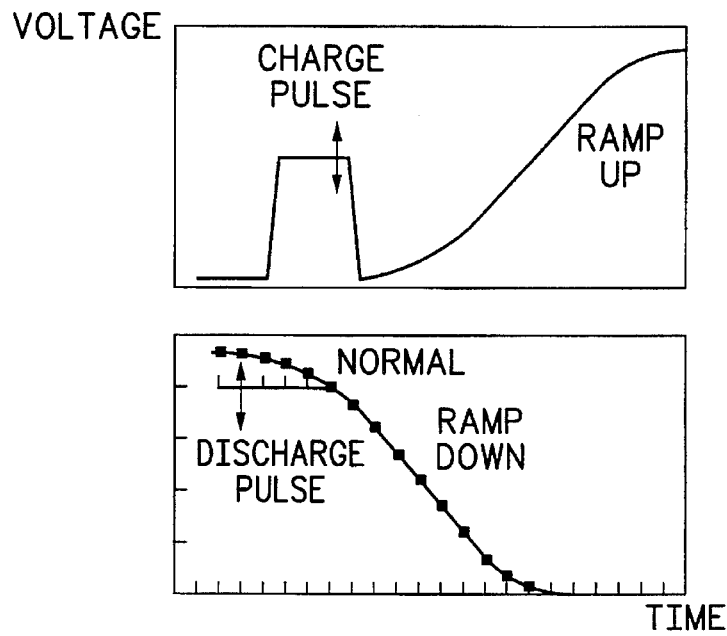
FIG. 9a is a diagrammatic representation of the voltage signals applied to the input of the control means of the power amplifier shown in FIG. 8a during ramp-up and ramp-down.
Figure 9B:
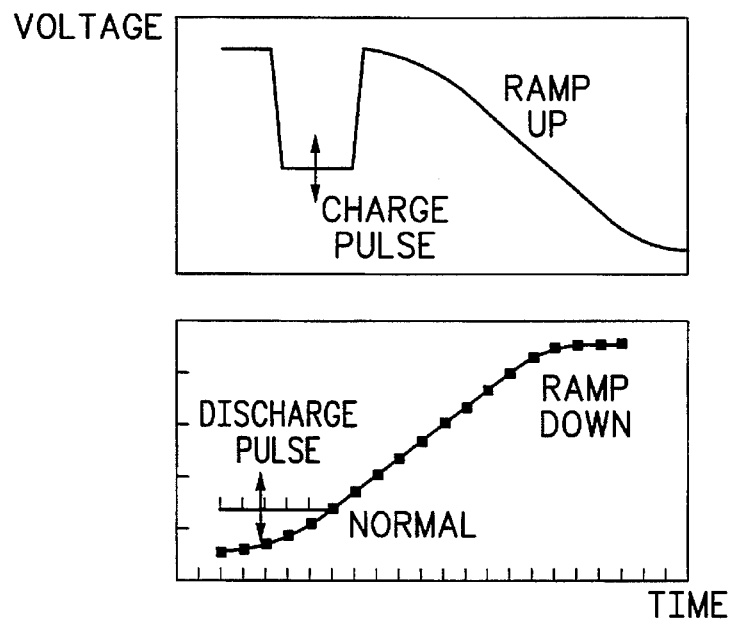
FIG. 9b is a diagrammatic representation of the voltage signals applied to the input of the integrator of the power amplifier shown in FIG. 8b during ramp-up and ramp-down.

The ramp currents and voltages for the arrangements shown in FIGS. 8a and 8b are shown in FIGS. 9a and 9b respectively. With the arrangement shown in FIG. 8b, it is necessary to invert the ramp voltage because a low voltage will give a high output power, while a high ramp voltage will give no output power. The charge pulse is, therefore, also inverted as seen in the curves of FIG. 9b. The detector voltage however, is still high for a high power and low for a low power. If the detector voltage rises too late, the charge pulse voltage must be decreased. If the detector voltage rises too soon, then the charge pulse voltage must be increased. This is the only difference in operation between the power amplifier of FIG. 8b and that of FIG. 7. All the principles of the adaptive ramp up are still exactly as previously described.

The manner in which the present invention ensures that the integrator 102 is always discharged by the correct amount at the end of the burst will now be described with reference to FIG. 7. It will be appreciated that the operation will be the same for the arrangements shown in FIGS. 8a and 8b excepting that the ramp-down voltage for the arrangement of FIG. 8b is inverted as can be seen in FIG. 9b.

Figure 10A:
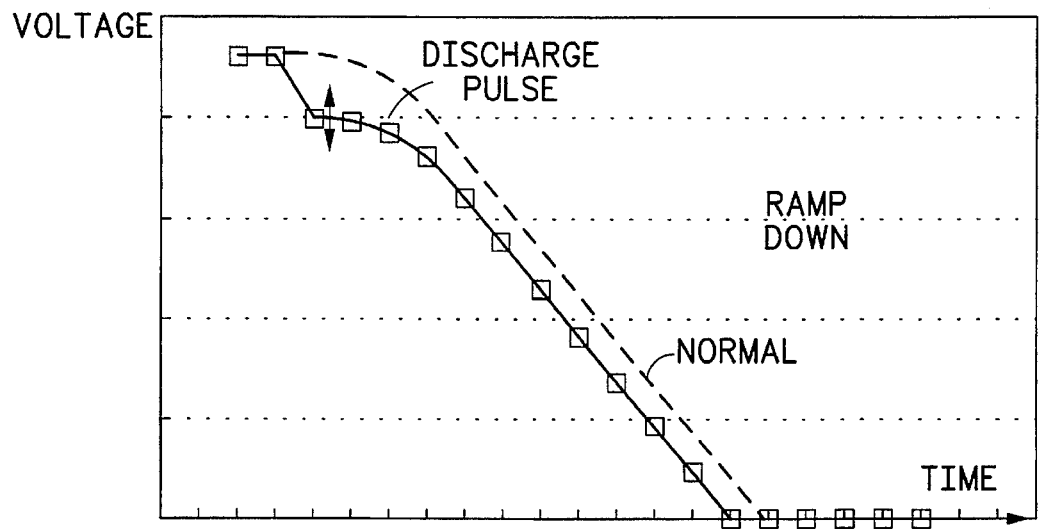
FIGS. 10a–10c are diagrammatic representations of the different voltage signals which can be applied to the input of the control means of a power amplifier in accordance with the present invention during ramp-down.
Figure 10B:
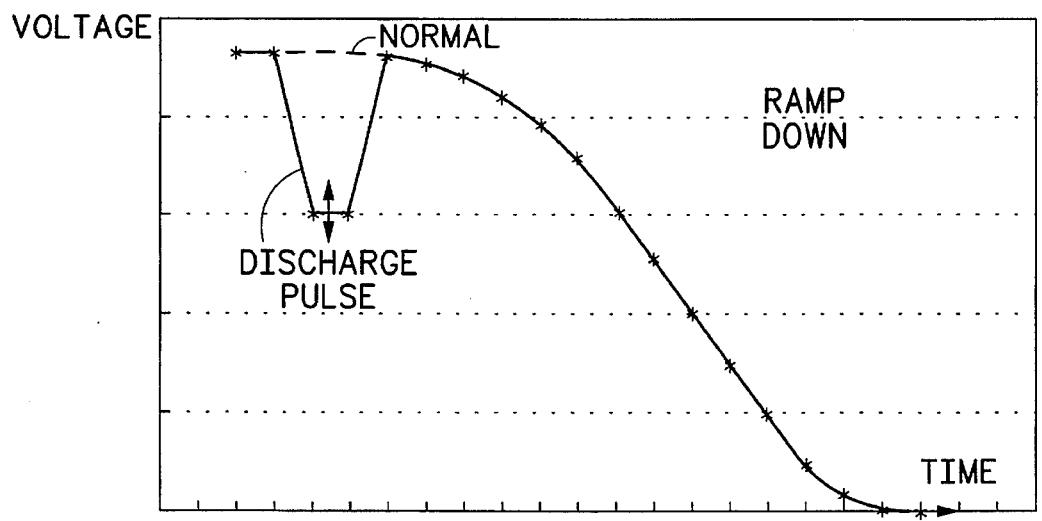
Figure 10C:
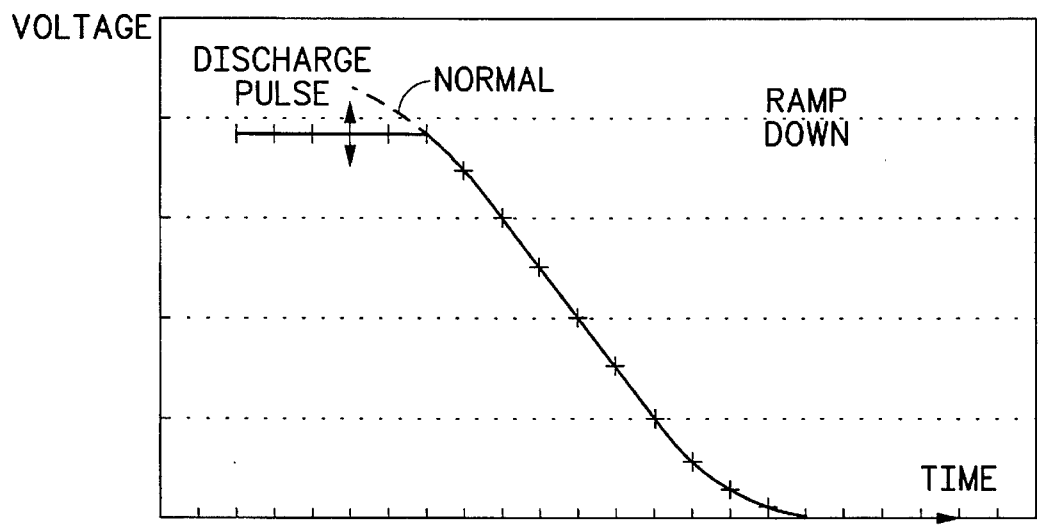

To discharge the integrator 102 faster whilst not compromising the stability of the loop, a special discharge pulse arrangement is used. FIGS. 10a–10c show three different examples of discharge pulses which can be used in the present invention. In FIG. 10a, the discharge pulse value is added to the entire ramp-down waveform. In FIG. 10b a narrow discharge pulse is applied before the ramp-down starts and in FIG. 10c, a wide discharge pulse is applied and the ramp-down is continued from that level. The principle of operation of the power amplifier 100 is the same for each of the different discharge pulses and will now be described with reference to the discharge pulse shown in FIG. 10c.

Figure 3:
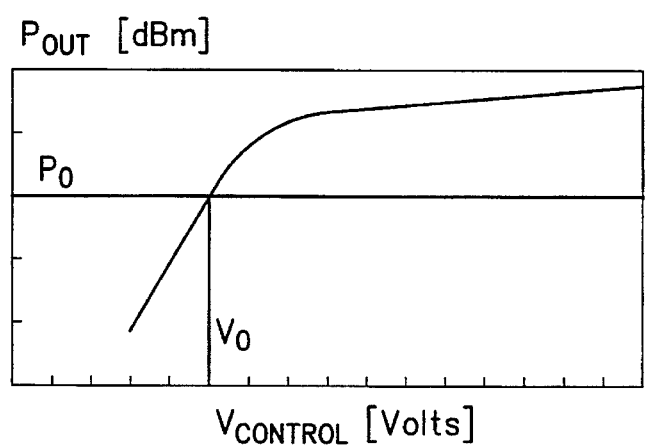
FIG. 3 is a diagrammatic representation of the output power of the power amplifier of FIG. 2 versus a control voltage from the control means.
Figure 4A:
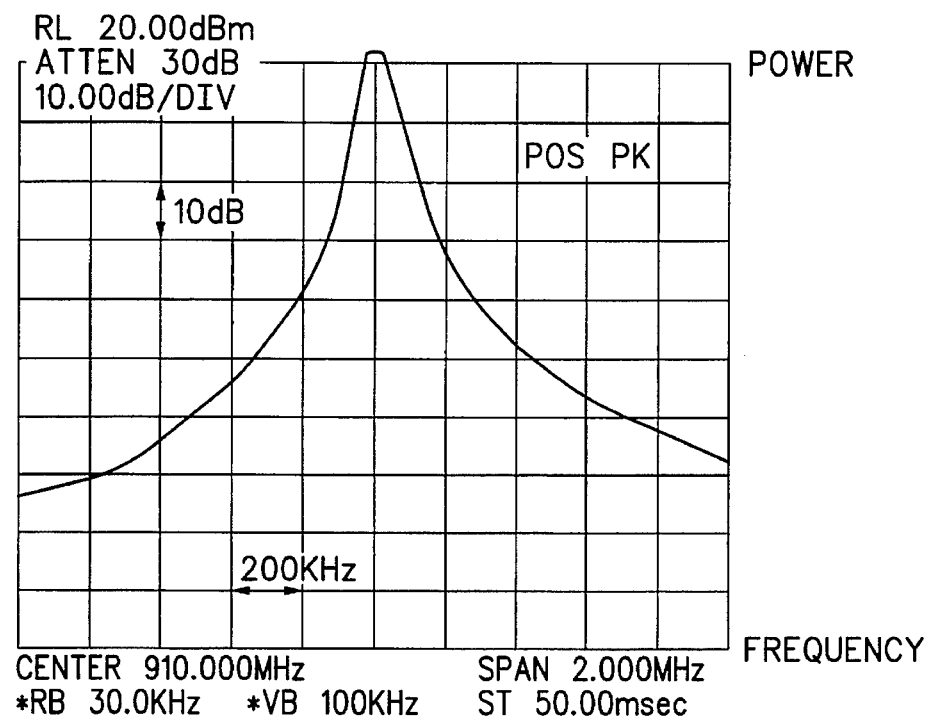
FIG. 4a is a diagrammatic representation of the output power versus frequency of the power amplifier of FIG. 2 having, in operation, a large integrator charge time.
Figure 4B:
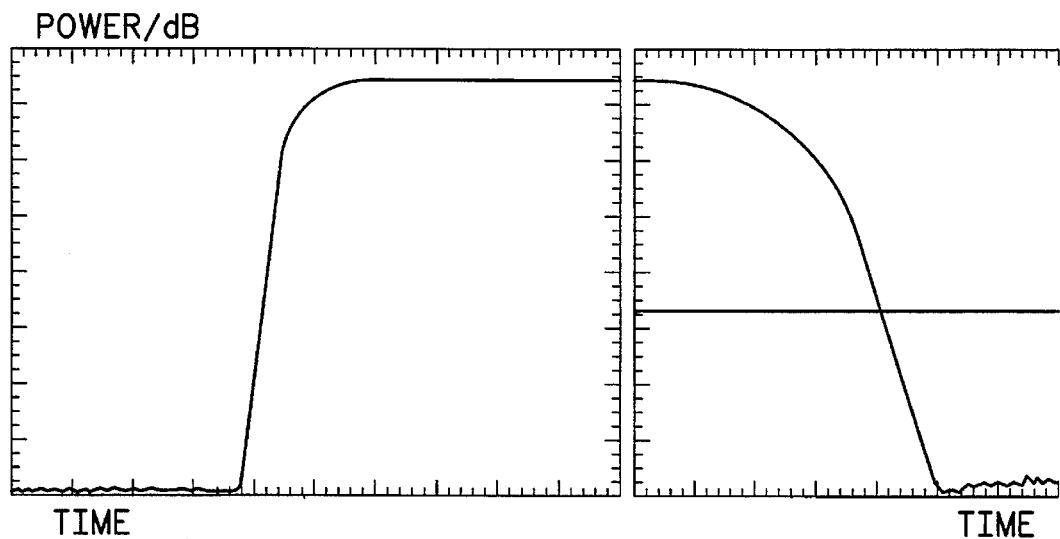
FIG. 4b is a diagrammatic representation of the output power versus time of the power amplifier of FIG. 2 having, in operation, a large integrator charge time.
Figure 5A:
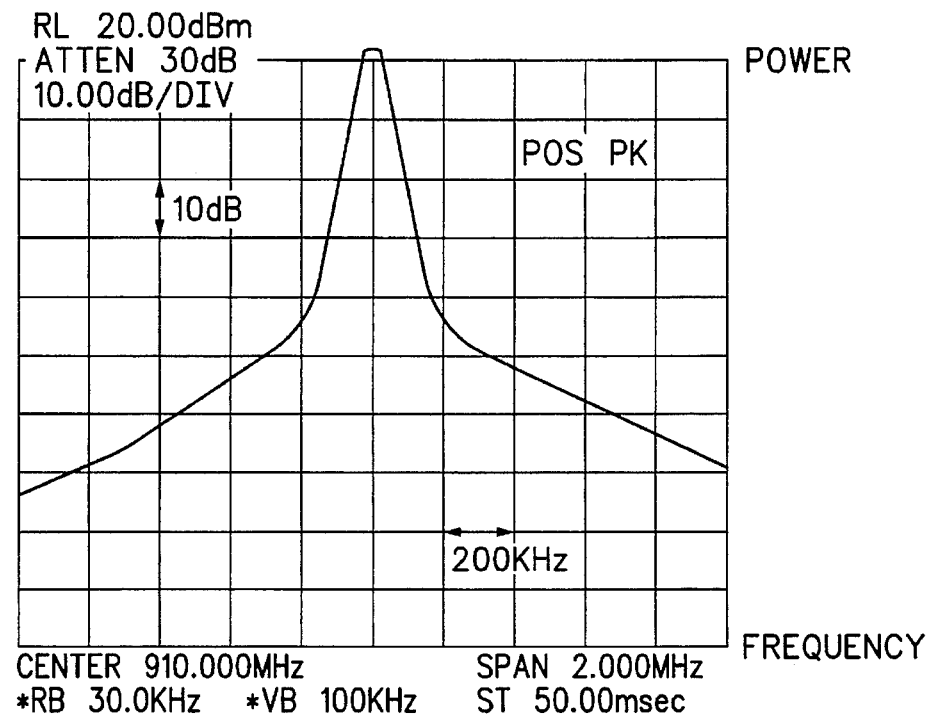
FIG. 5a is a diagrammatic representation of the output power versus frequency of the power amplifier of FIG. 2 having, in operation, a small integrator charge time.
Figure 5B:
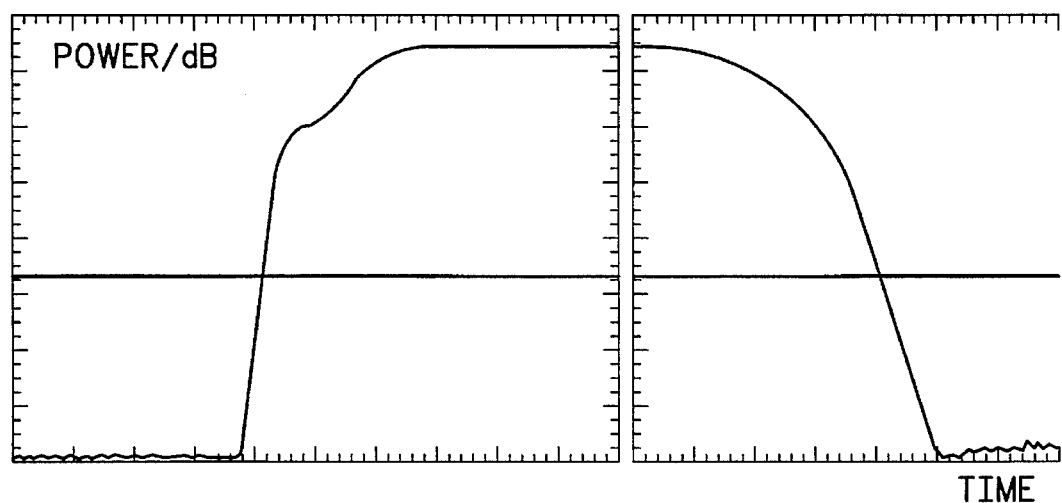
FIG. 5b is a diagrammatic representation of the output power versus time of the power amplifier of FIG. 2 having, in operation, a small integrator charge time.

The comparator 132 is used to detect if the integrator 102 output, $V_{control}$, goes above a fixed fraction of the supply voltage (or any other threshold level which is relevant in a given application). If $V_{control}$ is above this threshold when the ramp-down is about to begin, the discharge pulse is used. If $V_{control}$ is not above the threshold, the pulse is not used and the normal ramp-down is followed: this is shown by the dotted lines in FIGS. 10a–10c. In this way the special discharge pulse arrangement is only used when high output power levels are desired and this will depend on the actual supply voltage. That is, when the graph of $P_{out}$ versus $V_{control}$ is the most flat: see FIG. 3.

When the $V_{control}$ falls below the threshold voltage, the output from the comparator 132 causes the instantaneous value of the timer 116 to be latched in the latch 134. This timer value B' is applied to the first input of the fourth comparator 137 and is then compared with a predefined ideal reference time A' from the reference time source 138. If $V_{control}$ falls below the threshold voltage later than the ideal reference time, the discharge pulse in the next burst must be stronger than in the present burst. On the other hand, if $V_{control}$ falls below the threshold too soon compared with the reference time, the discharge pulse is too strong and must be reduced before the next burst. The value of the discharge pulse is stored in the counter 142.

The counter 142 uses the output from the comparator 137 to determine the size of the discharge pulse to be applied to the integrator 102 in the next burst. The amount of change in the discharge pulse size can be selected in response to the output from the comparator 137 under the control of the controller 120. The discharge pulse is then applied to the positive input of integrator 102 via multiplexer 128, digital-to-analog converter 130 and low pass filter 131.

Thus, it will be appreciated that since the size of the discharge pulse can be varied according to how long it takes the control voltage, $V_{control}$, to fall below the threshold voltage level, the effect of variations of temperature, supply voltage, radio frequency and input power on the power ramp-down is eliminated. That is, the present invention provides an adaptive ramp-down at the end of the burst.

In order that the power amplifier 100 operates perfectly or as near to perfectly as possible during the very first bursts, an initial discharge pulse value can be downloaded to the power amplifier. The controller 120 downloads a value to the counter 142. If this value is based on knowledge of temperature, supply voltage, radio frequency and input power, the first burst will be substantially perfect: i.e. the detected time B' will be substantially equal to or very close to the desired time A'. If the downloaded discharge pulse value is not correct, the first burst will not be perfect but the adaptive ramp-down principle outlined above ensures that after a very few more bursts, the burst will become perfect and will remain so. Variations in temperature, supply voltage, radio frequency and input power has no effect on the time mask and frequency mask.

As with the charge pulse described above, the initial value for the discharge pulse may be stored in a look-up table.

The choice between the three different discharge pulses (shown in FIGS. 10a–10c) and other essentially similar pulses, will depend upon the ease of implementation and the particular power amplifier and operating conditions. However, an important factor is the adaptive nature of the size of the pulse.

In summary, the present invention uses adaptive ramp-up and adaptive ramp-down in order to ensure that the power amplifier operates substantially perfectly even when temperature, supply voltage, radio frequency and input power changes. It will be appreciated therefore that this provides for very robust power amplifiers and ones which can be used in mobile equipment being manufactured on a large scale.

I claim:

1. A pulsed power amplifier for amplifying radio frequency signals comprising:

control means for generating control signals ($V_{control}$) to control the amplifier output power so as to provide an output power pulse having rising and falling transitional phases;

means for generating a subsidiary pulse signal to be applied to said control means in order to adjust a transitional phase of the output power pulse;

sensing means coupled to said control means and said generating means for sensing the output power of the power amplifier, and said generating means comprises:

a first comparator having a first input coupled to the sensing means for receiving a signal representing the output power of the power amplifier and a second input coupled to a first reference signal, said first comparator generating an output signal when the output power signal sensed by the sensing means is equal to the first reference signal;

a first latch coupled to the output of the first comparator and to a clock and having an output, said latch being arranged to latch the value of the clock signal in response to receiving the output signal from the first comparator;

a second comparator having a first input coupled to a first reference clock signal, a second input coupled to said output of the latch and an output; and variable charge pulse generating means coupled to the output of said second comparator and to said control means, said second comparator providing an output signal according to the comparison of the latched clock signal with said first reference clock signal whereby said variable charge pulse generating means generates a subsidiary pulse immediately before the start of the rising transitional phase having a magnitude responsive to the output signal from the second comparator.

2. A pulsed power amplifier according to claim 1 wherein said generating means further comprises:

a third comparator having a first input for receiving control signals ($V_{control}$) from the control means, a second input coupled to a second reference signal, said third comparator generating an output signal when the received control signal is greater than the second reference signal;

a second latch coupled to the output of the third comparator and to a clock and having an output, said second latch being arranged to latch the value of the clock signal in response to receiving the output signal from the third comparator; and a fourth comparator having a first input coupled to a second reference clock signal, a second input coupled to said output of the second latch and an output; and variable discharge pulse generating means coupled to the output of said fourth comparator and to said control means, said fourth comparator providing an output signal according to the comparison of the latched clock signal with said second reference clock signal whereby said discharge pulse generating means generates a subsidiary pulse to adjust the falling transitional phase having a magnitude responsive to the output signal from the fourth comparator.

3. A pulsed power amplifier according to claim 2 wherein said variable charge pulse generating means comprises first counting means for generating in response to the output from said second comparator a signal representing the magnitude of the subsidiary charge pulse signal to be applied to the control means and said variable discharge pulse generating means comprises second counting means for generating in response to the output from said fourth comparator a signal representing the magnitude of the subsidiary discharge pulse signal to be applied to the control means.

4. A pulsed power amplifier according to claim 3 wherein each one of said first and second counting means generates one value of a sequence of values, each of said values representing a different level of magnitude of the subsidiary pulse.

* * * * *